(12) United States Patent
Otsuki et al.

(10) Patent No.: US 7,123,483 B2
(45) Date of Patent: Oct. 17, 2006

(54) HEAT SINK FAN AND METHOD FOR MANUFACTURING HEAT SINK THAT IS USED FOR THE HEAT SINK FAN

(75) Inventors: Takaya Otsuki, Kyoto (JP); Masahiro Ishikawa, Kyoto (JP)

(73) Assignee: Nidec Corporation, Kyoto (JP)

( * ) Notice: Subject to any disclaimer, the term of this patent is extended or adjusted under 35 U.S.C. 154(b) by 123 days.

(21) Appl. No.: 10/708,400

(22) Filed: Mar. 1, 2004

(65) Prior Publication Data
US 2005/0141193 A1 Jun. 30, 2005

(30) Foreign Application Priority Data
Dec. 26, 2003 (JP) .............................. 2003-435730

(51) Int. Cl.
*H05K 7/20* (2006.01)
*H01L 23/40* (2006.01)
*H01L 23/467* (2006.01)
*H01L 23/36* (2006.01)

(52) U.S. Cl. ...................... 361/710; 361/695; 361/697; 361/709; 257/719; 257/722

(58) Field of Classification Search ................ 361/695, 361/697, 709, 710; 257/719, 722
See application file for complete search history.

(56) References Cited

U.S. PATENT DOCUMENTS

| | | | |
|---|---|---|---|
| 5,484,013 A | 1/1996 | Morikawa et al. | 165/80.3 |
| 5,579,827 A * | 12/1996 | Chung | 165/80.3 |
| 5,597,034 A * | 1/1997 | Barker et al. | 165/80.3 |
| 5,794,685 A | 8/1998 | Dean | 165/121 |
| 6,302,189 B1 | 10/2001 | Lin et al. | 165/80.3 |
| 6,336,499 B1 * | 1/2002 | Liu | 165/80.3 |
| 6,386,274 B1 * | 5/2002 | Wang et al. | 165/80.3 |
| 6,392,885 B1 | 5/2002 | Lee et al. | 361/697 |
| 6,407,919 B1 | 6/2002 | Chou | 361/697 |
| 6,414,848 B1 * | 7/2002 | Chen | 361/704 |
| 6,415,852 B1 | 7/2002 | Lo | 165/80.3 |
| 6,419,007 B1 * | 7/2002 | Ogawara et al. | 165/80.3 |
| 6,515,862 B1 * | 2/2003 | Wong et al. | 361/710 |
| 6,520,250 B1 | 2/2003 | Lee et al. | 165/121 |
| 6,538,888 B1 * | 3/2003 | Wei et al. | 361/697 |
| 6,879,487 B1 * | 4/2005 | Simon et al. | 361/697 |
| 2002/0139518 A1 * | 10/2002 | Lee et al. | 165/121 |
| 2003/0024688 A1 | 2/2003 | Dowdy et al. | 165/80.3 |
| 2003/0024693 A1 | 2/2003 | Petty et al. | 165/121 |
| 2003/0048612 A1 | 3/2003 | Carter et al. | 361/718 |
| 2003/0131970 A1 * | 7/2003 | Carter et al. | 165/80.3 |
| 2004/0136180 A1 | 7/2004 | Lee et al. | |

FOREIGN PATENT DOCUMENTS

| | | |
|---|---|---|
| CN | 1379304 A | 11/2002 |
| JP | 2003-258473 A | 9/2003 |
| JP | 2004-235171 A | 8/2004 |

* cited by examiner

*Primary Examiner*—Anatoly Vortman
(74) *Attorney, Agent, or Firm*—Judge & Murakami IP

(57) ABSTRACT

A heat sink fan includes a heat sink (2) that is placed on a heat generating electrical component and a fan motor unit (4) having an axial flow fan (18) for supplying cooling air to the heat sink (2). A engaging portions (14a) of an arm portions (14) of the fan motor unit (4) is engaged with a recesses (10b) of the heat sink (2). Thus, movement of the fan motor unit (4) in the axial direction of the heat sink (2) is restricted so that the fan motor unit (4) is attached to the heat sink (2) securely.

12 Claims, 6 Drawing Sheets

HEAT SINK FAN AND METHOD FOR MANUFACTURING HEAT SINK THAT IS USED FOR THE HEAT SINK FAN

BACKGROUND OF INVENTION

1. Field of the Invention

The present invention relates to a heat sink fan for cooling a micro processing unit (MPU) or other electrical component and a method for manufacturing a heat sink that is used for the heat sink fan.

2. Description of the Prior Art

A heat sink fan that is attached to an MPU or other heat generating electrical component usually includes a heat sink having a plurality of heat radiating fins that are placed on a MPU and extend radially from the central portion. The heat sink fan also includes a fan motor unit that has an axial flow fan with an impeller, which is surrounded by the heat radiating fins and is disposed at the central portion of the heat sink and at the inner side of the heat radiating fins. The heat radiating fins of the heat sink are cooled by air flow supplied by the axial flow fan.

One of structures for attaching the fan motor unit to the heat sink is disclosed in U.S. Pat. No. 6,419,007, for example. In this structure, a fan motor unit having a housing made of a synthetic resin is disposed above the heat sink, and four arm portions are formed at the periphery portion of the housing. Each of the arm portions extends from the housing to a base plate that is provided at the lower end of the heat sink so as to cover the outer side of the heat sink. A engaging portion is formed at the tip of the arm portion, and the engaging portion is engaged with an engaged portion formed on the base plate of the heat sink.

Another structure is disclosed in U.S. Pat. No. 5,484,013. In this structure, a housing of a fan motor unit is provided with a protrusion connecting integral to the housing and an arm portion connecting integral to the periphery of the housing. A pawl portion is provided at the tip of the arm portion. On the other hand, the heat sink is provided with a recess for receiving the protrusion of the housing and a flange portion for receiving the pawl portion of the housing. The protrusion of the housing is engaged with the recess of the heat sink, while the pawl portion of the housing is engaged with the flange portion of the heat sink, so that the fan motor unit is attached to the heat sink.

Recently, the amount of heat generated by an MPU has been increasing along with increase of processing speed and downsizing or larger scale of integration of the MPU. Therefore, the heat sink fan for cooling the MPU is required to be capable of supplying more cooling air to the heat sink so as to increase cooling efficiency.

However, if a rotation speed of the axial flow fan is increased so as to enhance the cooling efficiency for satisfying the above-mentioned requirement, the following problem may happen. Namely, the above-mentioned structure in which four arm portions extend from the housing to the substrate provided at the lower end of the heat sink has a disadvantage that when the air flow supplied by the axial flow fan flows along the heat radiating fins and is dissipated outside the heat sink, the arm portions disposed at the outer side of the heat radiating fins may interrupt the air flow. As a result, the air flow cannot be dissipated sufficiently into the outside of the heat sink, so that the cooling efficiency of the heat sink may be deteriorated. If members such as the arm portions exist more at the outer side of the heat radiating fins, or if the area where the members exist is larger, the air flow is interrupted more so that the cooling efficiency of the heat sink is deteriorated more. Therefore, it is desirable that there are as little members as possible at the outer side of the heat radiating fins.

In addition, if the arm portions of the housing are extended toward the lower end of the heat sink, a length of the arm portions becomes longer. As a result, the arm portions become easy to generate a distortion such as warping at the tip of the arm portion when housing is formed by resin molding. Consequently, it becomes difficult to finish precisely an engaging portion such as the pawl portion at the tip of the arm portion. In this case, it becomes difficult to attach the fan motor unit to the heat sink properly.

Moreover, the heat sink fan is also required to be inexpensive. Therefore, it is necessary to provide the heat sink fan with a simple structure that enables the fan motor unit to be attached to the heat sink easily and securely.

SUMMARY OF INVENTION

An object of the present invention is to provide a heat sink fan that can increase quantity of air flow from an axial flow fan so as to improve cooling efficiency of a heat sink.

Another object of the present invention is to reduce a number of components that constitute a structure for attaching a fan motor unit having the axial flow fan to the heat sink so as to realize a simplest structure.

Still another object of the present invention is to reduce a cost of manufacturing the heat sink fan.

Still another object of the present invention is to attach the fan motor unit to the heat sink more steadily and more securely.

A heat sink fan according to an example of the present invention includes a heat sink having a base portion with a central axis and a plurality of heat radiating fins extending away from the central axis and at least one end rim face, and a fan motor unit having an axial flow fan for supplying cooling air to the heat sink and a housing unit for supporting the axial flow fan.

The housing unit of the fan motor unit include a housing and at least one arm portions extending to the heat sink, and an engaging portion is formed at a tip of the arm portion. On the other hand, protrusion or recess that are formed on the envelope surface of the end rim face of the heat radiating fins. The engaging portion of the fan motor unit are engaged with the protrusion or recess of the heat sink so that the fan motor unit is attached to the heat sink.

According to this structure, the fan motor unit can be attached to the heat sink steadily and securely.

In addition, a heat sink according to an example of the present invention is manufactured by the following method. First, the heat sink having a base portion with a central axis and a plurality of plate heat radiating fins extending radially in the direction away from the central axis is made. Next, protrusion or recess is formed on the envelope surface of the end rim faces of the heat radiating fins by machining process.

According to this structure, protrusion or recess of the heat sink can be formed easily and precisely.

DETAILED DESCRIPTION

Figure 1:
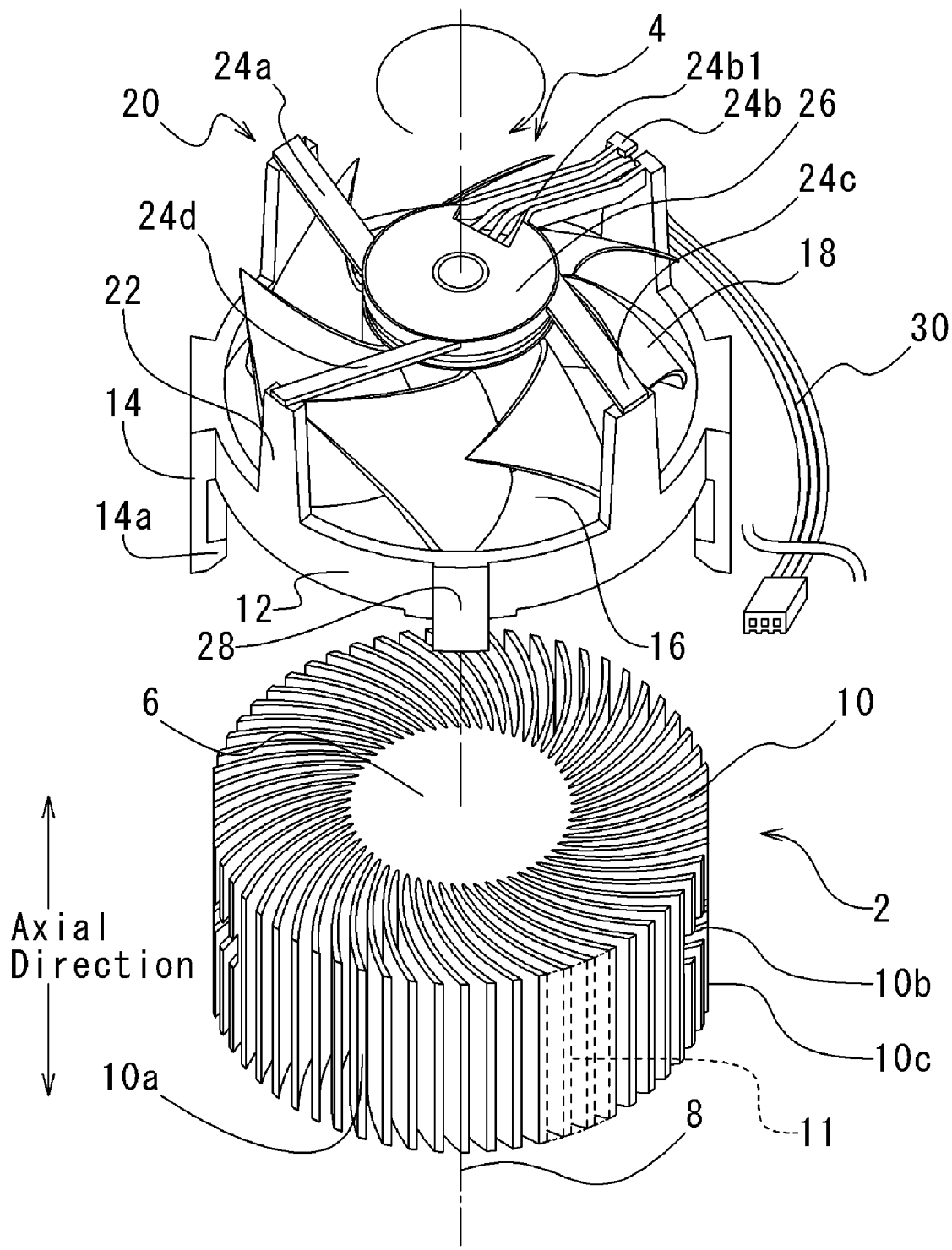
FIG. 1 is a exploded perspective view of a heat sink fan according to a first embodiment of the present invention.

Hereinafter, a heat sink fan and a method for manufacturing a heat sink that is used for the heat sink fan in each embodiment of the present invention will be explained with reference to FIGS. 1 to 6. Although the vertical direction of the drawing is used as the vertical direction in the explanation of each embodiment of the present invention, the direction in the real attachment state is not limited by the explanation or the drawing.

As shown in FIG. 1, a heat sink fan according to the first embodiment of the present invention includes a heat sink 2 and a fan motor unit 4 that is detachably attached to the heat sink 2.

The heat sink 2 is a substantially circular member, which is made of aluminum, aluminum alloy, copper, copper alloy or other metal having relatively high thermal conductivity by an extrusion or other processes. The heat sink 2 includes a column-like base portion 6 having a lower end surface (6a in FIG. 2) that is placed on an MPU or other electronic component and a central axis 8 that is perpendicular to the lower end surface 6a. The heat sink 2 has a plurality of heat radiating fins 10 that are connected integrally to the outer peripheral surface of the base portion 6 and extending radially away from the central axis. The heat radiating fins 10 are arranged and distributed equally in the circumferential direction. Each of the heat radiating fins 10 radially extends with a curved shape from the base portion 6. Each end rim faces 10a is formed at the outer end of each of the heat radiating fins 10. A set of adjoining end rim faces 10a defines a surface that envelopes the faces 10a (hereinafter this surface is referred to as an envelope surface 11).

Although the base portion and the heat radiating fins are formed integrally in this embodiment, there can be other structures. For example, the heat sink may be made up of a base member and heat radiating fins. In this case, the base member is made of metal having higher thermal conductivity such as copper or copper alloy, and the heat radiating fins are made of aluminum, aluminum alloy, copper or copper alloy. The base member is fixed to the heat radiating fins by a press fitting to make a heat sink. Since the base member having high thermal conductivity is placed directly on the MPU that generates heat, and the cooling efficiency of the heat sink is enhanced. In addition, it is possible to form two or more end rim faces in each of the heat radiating fins.

Figure 2:
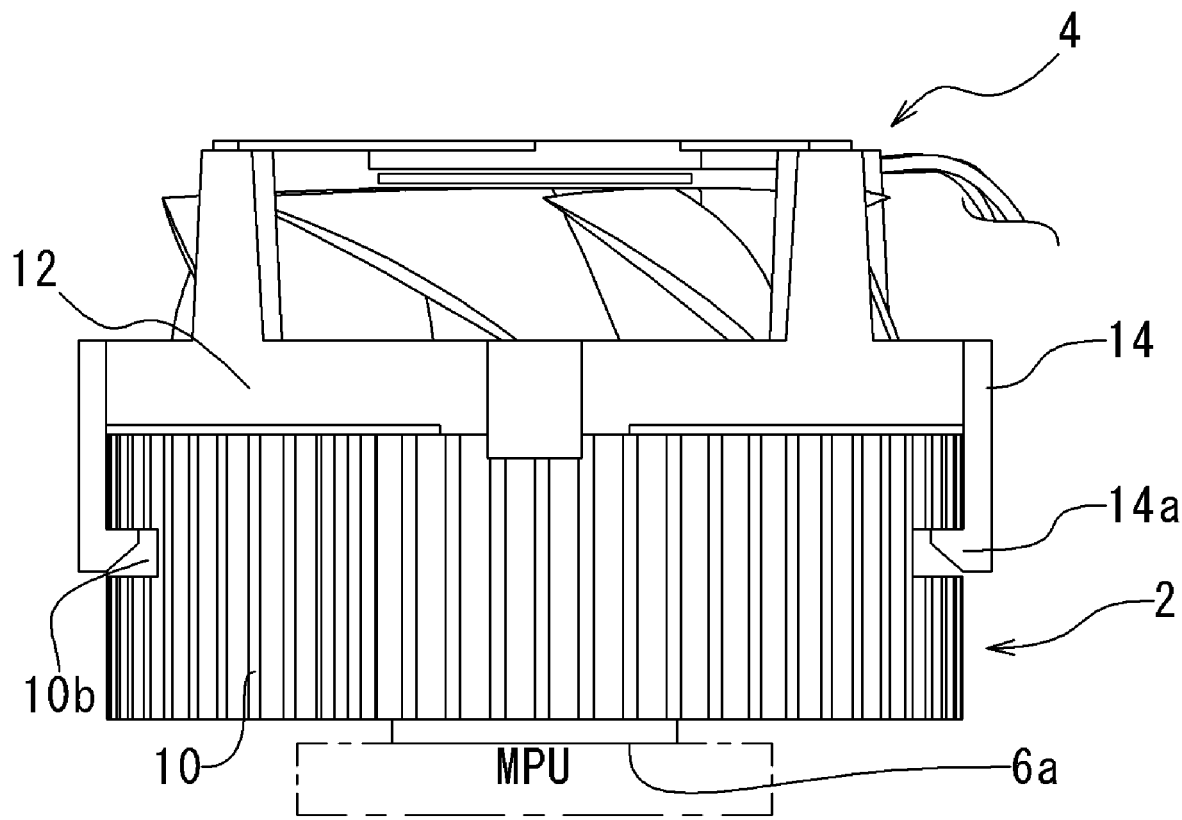
FIG. 2 is a side view of a heat sink fan illustrated in FIG. 1.

On the other hand, the fan motor unit 4 has a substantially circular housing 12 that is arrange at the upper side (corresponding to a first end side) of the heat sink 2 in the axial direction (the upper side in FIGS. 1 and 2). The fan motor unit 4 also has arm portions 14 extending from the housing 12 to the lower side (corresponding to a second end side) in the axial direction (the lower side in FIGS. 1 and 2). A circular hole 16 is formed in the middle portion of the housing 12 of the fan motor unit 4, and a support portions 20 for supporting the axial flow fan 18 is arranged above and around the circular hole 16.

Each support portion 20 includes a support pillar portion 22 around the circular hole 16 and an extending portion 24a extending from the upper end of the support pillar portion 22 to the inside toward the central axis 8. In this embodiment the fan motor unit 4 has four support portions 20 and four extending portions 24a–24d. The fan motor unit 4 also includes a disk portion 26 arranged above the circular hole 16, and fixed to each inner ends of the four extending portions 24a–24d. For supporting the axial flow fan 18, the upper end of the axial flow fan 18 is fixed to the disk portion 26. In this case the disk portion 26 is positioned above the housing 12 in the axial direction held by the support pillar portions 22 and the extending portions 24a–24d. Thus, the axial flow fan 18 is also positioned above the housing 12 in the axial direction. Therefore, the axial flow fan 18 is retained with the entire circumference being exposed out of the fan motor unit 4. The axial flow fan 18 inhales an ambient air as a cooling air through the inlet openings defined by the neighboring support pillar portions 22 and one of the extending portions 24a–24d, and the air flow is blown toward the heat sink 2 for cooling the heat sink 2. Furthermore, the axial flow fan 18 can be detachably attached to the disk portion 26. The heat sink fan of the present invention can be used semi-permanently by replacing the worn axial flow fan 18 with a new one.

In addition, the extending portion 24b is provided with a guide groove 24b1 opening upward over the entire length of the extending portion 24b. This guide groove 24b1 is used for leading out electric wires 30 that connect the axial flow fan 18 with an external power source electrically.

In addition, the housing 12 is provided with a pair of positioning portions 28 formed at the opposing two positions on the outer circumference of the housing 12, and a pair of arm portions 14 formed at other opposing two positions on the outer circumference of the housing 12. Wherein these positions has the relation that an imaginary line (not shown on FIG. 1) connecting the two positions of the positioning portions 28 is perpendicular to another imaginary line (also not shown on FIG. 1) connecting the positions of the arm portions 14. The positioning portions 28 extend from the housing 12 downward and contact the envelope surface 11 of the heat radiating fins 10. The pair of arm portions 14 and 14 and the pair of positioning portions 28 and 28 prevent the housing 4 securely from moving or sliding away from the center position of the heat sink 2 in the radial direction. Although the pair of positioning portions 28 and 28 are provided in this embodiment, they can be provided more or only one.

In addition, there are two portions 10c having flat envelope surfaces on the envelope surface 11 on which recesses 10b are formed as being explained later. The flat envelope portions 10c is formed in parallel to the central axis 8. In addition, the flat envelope portions 10c is formed by cutting the end of corresponding heat radiating fins 10 so that the length of them that is extending radially away from the central axis 8 become shorter than other heat radiating fins 10. When the fan motor unit is set on the heat sink 2, the inner surfaces of the positioning portions 28 are closely contacted with the flat envelop portions 10c. Thus, only a slight movement or a slight slide of the fan motor unit 4 on the heat sink 2 in the radial direction can be prevented. A plurality of the flat envelop portions 10c can be formed on the envelope surface 11 of the heat sink 2. For example, the flat envelope portion may be formed on the envelope surface 11 of the heat sink 2 at the position opposing the positioning portions 28 of the fan motor unit 4. Thus, the area where the positioning portions 28 contacts the envelope surface 11 can be increased, so that the effect of preventing the fan motor unit 4 from moving on the heat sink 2 from or toward the central axis 8 can be enhanced.

As a material of the housing 12, an engineering plastic resin or other material having a heat-resistant property, a small coefficient of thermal expansion and a good dimensional stability is preferable. Especially, saturated polyester is preferable since it is easy to work or make forming. More specifically, polybutylene terephthalate (PBT) or polyethylen terephthalate (PET) reinforced with glass fibers is suitable. Content of the glass fiber can be determined in accordance with a mechanical strength or a dimension stability that is required. Usually, it is preferable that the content of the glass fiber be within a range of 10–40 weight percent, particularly 25–35 weight percent. A method for making the housing 12 using the above-mentioned material is not limited but can be a conventional method such as an injection molding.

Figure 3:
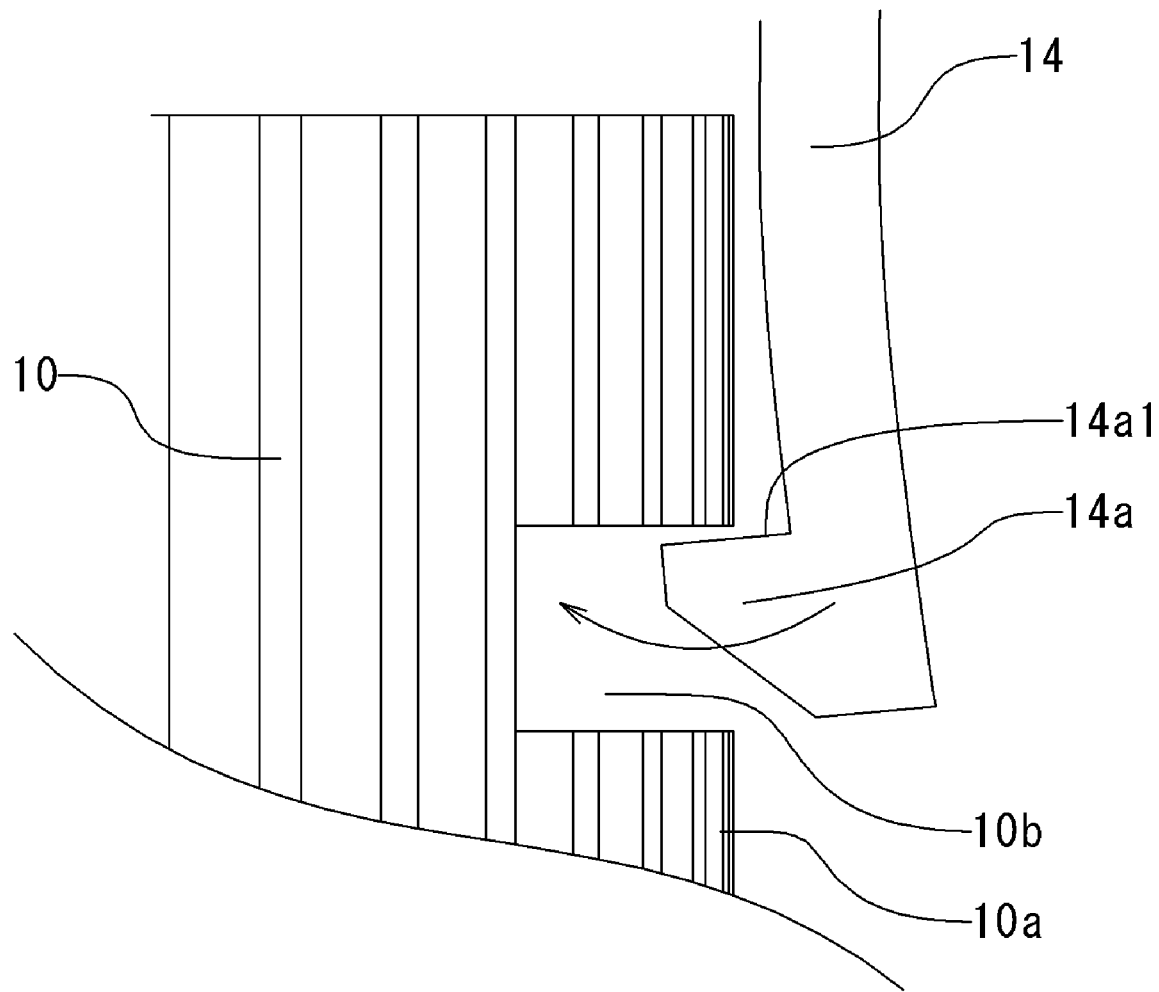
FIG. 3 is a partial enlarged side view showing a method of attaching the fan motor unit to the heat sink illustrated in FIG. 1.

Next, features of the present invention will be explained in detail with reference to FIGS. 1–3. FIG. 3 is a partial enlarged side view showing a method of attaching the fan motor unit 4 to the heat sink 2 illustrated in FIG. 1.

As shown in FIGS. 2 and 3, recesses 10b are concave portions in the radial direction getting close to the central axis 8, and are formed on the envelope surface 11 of the heat sink 2. The recesses 10b are formed by machining the envelope surface 11 by using a cutting tool after forming the base portion 6 and the heat radiating fins 10 by an extrusion process.

On the other hand, an engaging portion 14a is formed at the tip of each of arm portions 14 of the housing 12. The engaging portion 14a has a pawl-like shape with a flat surface 14a1 extending from the tip portion of the arm portions 14 toward the central axis 8.

As shown in FIG. 1, in order to attach the fan motor unit 4 to the heat sink 2, the arm portions 14 of the fan motor unit 4 are positioned above the recesses 10b of the heat sink 2 in the axial direction, and the fan motor unit 4 is moved downward in the axial direction of the heat sink 2. As shown in FIG. 3, the engaging portions 14a of the arm portions 14 of the fan motor unit 4 contact the end rim faces 10a of the heat sink 2 and are expanded a little in the radial direction away from the central axis 8 by an elastic deformation. When the engaging portions 14a reach the recesses 10b of the heat sink 2, the engaging portions 14a fit in the recesses 10b by the elastic restoring force of the arm portions 14. On this occasion, the flat surfaces 14a1 of the engaging portions 14a engage the upper end wall surfaces of the recesses 10b, where each end wall surface is formed as an envelope surface which envelopes lower end faces cut so as to make the recess 10b of the corresponding fins 10. As a result, movement of the fan motor unit 4 is restricted in the axial direction, so that the fan motor unit 4 is attached to heat sink 2 securely. In order to detach the heat sink 2 from the fan motor unit 4, the engaging portions 14a are pressed outward slightly away from the central axis 8 first so that the engagements between the recesses 10b of the heat sink 2 and the engaging portions 14a are released. Then, the fan motor unit 4 is moved upward from the heat sink 2 in the axial direction. In this way, the fan motor unit 4 can be detached from the heat sink 2. Thus, the fan motor unit 4 is detachably attached to the heat sink 2.

Furthermore, the shape of the engaging portions 14a of the fan motor unit 4 is not limited to the pawl-like shape but various conventional shapes can be adopted. For example, a hook shape is also possibly adopted as the shape of the engaging portions. In addition, although two arm portions 14 and two engaging portions 14a and two recesses 10b are provided as shown in FIGS. 1 and 2, it is possible to provide only one or more than two for each of the arm portions 14 and engaging portions 14a and recesses 10b.

When the axial flow fan 18 is turned in a predetermined direction in the heat sink fan of this embodiment (in the clockwise direction in this embodiment), the ambient air as the cooling air is inhaled through the circular hole 16 of the fan motor unit 4, and the air flow is blown toward the heat sink 2 and flows along the heat radiating fins 10. On the other hand, heat generated by the MPU or other electrical component is conducted to the plural heat radiating fins 10 via the lower end surface 6a of the base portion 6 of the heat sink 2. Then, the air flow supplied from the axial flow fan 18 flows along the heat radiating fins 10 when the heat is transferred from the heat radiating fins 10 to the air flow. Thus, the heat generated by the electrical component is transferred from the heat sink 2 to the air flow and is dissipated by the air flow into the outside of the heat sink 2.

The axial flow fan 18 is positioned above the heat sink 2 so as to protrude from the housing 12 in the axial direction in this embodiment. Thus, the axial flow fan 18 can inhale ambient air as much as possible when the axial flow fan 18 rotates at a high speed. As a result, the axial flow fan 18 can blow much air flow toward the heat sink 2 so that cooling efficiency of the heat sink 2 can be improved.

In addition, the axial flow fan 18 generates a spiral air flow, and the heat radiating fins 10 arranged radially can receive the air flow efficiently so that the cooling efficiency of the heat sink 2 can be improved.

Conventionally, an axial flow fan is housed in a heat sink. In contrast, the axial flow fan is positioned above the heat sink in the axial direction in the present invention, so that heat radiating fins and a base portion can be arranged in the space where the axial flow fan was arranged conventionally in the heat sink. As a result, a heat radiating area of the heat sink 2 can be increased so that the cooling efficiency of the heat sink 2 can be further improved.

In addition, the recesses 10b are provided to the envelope surface 11 of the heat sink 2, while the engaging portions 14a are provided to the tip of the arm portions 14 of the fan motor unit 4 in the present invention. According to this structure, the fan motor unit 4 can be attached to the heat sink 2 securely with sufficient fixing strength by a simple structure without increasing members for the attachment. Moreover, a cost for manufacturing the heat sink fan can be reduced.

In addition, since the recesses 10b are provided to the envelope surface 11 of the heat sink 2, a length of the arm portions 14 extending downward in the axial direction from the housing 12 can be shortened. Thus, the section area of the arm portions 14 can be minimized. Namely, the areas of the arm portions 14 can be decreased to the extent that does not affect substantially the cooling efficiency of the heat sink 2. Accordingly, it is prevented that the arm portions 14 of the fan motor unit 4 interrupt the air flow when the air flow supplied from the axial flow fan 18 flows along the heat radiating fins 10 and dissipated into the outside of the heat sink 2. In addition, since the length of the arm portions 14 extending downward from the housing 12 in the axial direction can be shortened, distortion such as a warpage that can be generated easily when the housing 12 of the arm portions 14 is formed by resin molding can be prevented, so that the arm portions 14 can be formed with high accuracy.

In addition, the recesses 10b can be formed by a machining process using a cutting tool after the base portion 6 and the heat radiating fins 10 are formed by extrusion or other process. Accordingly, the recessed 10b can be formed by a simple process.

In addition, flexibility in designing the portion where the recesses 10b is formed can be increased. Namely, fastening strength between the fan motor unit 4 and the heat sink 2 on the envelope surface 11 can be increased, and the recesses 10b can be formed easily at the position that does not affect substantially the cooling efficiency of the heat sink 2, i.e., the position a little above from the middle of the heat sink 2 in the axial direction.

In addition, the heat radiating fins 10 of the heat sink 2 extend radially away from the central axis 8 a explained above, and the heat radiating fins 10 are formed in the shape curving in the opposite direction (counterclockwise direction) to the rotation direction of the axial flow fan 18 in this embodiment. Conventionally, there is a case where the air flow from the axial flow fan 18 cannot be blown efficiently to the base portion 6 that become the highest temperature in the heat sink 2 in the structure where the heat sink 2 is relatively close to the axial flow fan 18. However, if the heat radiating fins shape of this embodiment is used, the air flow from the axial flow fan 18 can be blown to the base portion 6 efficiently along the curved heat radiating fins 10. As a result, the cooling efficiency of the heat sink 2 becomes higher than the conventional structure. It is possible to make a shape of the heat radiating fins so as to extend slanting in a predetermined direction with respect to the central axis, and this structure can acquire the same effect as the present invention.

Next, a second embodiment of the present invention will be explained in detail with reference to FIGS. 4 and 5. The heat sink fan of this embodiment has the basic structure that is the same as the first embodiment, and each reference number used for each corresponding element is increased by 100. The explanation of the second embodiment will be described mainly about different portions from the first embodiment.

There are provided protrusions 110c on the envelope surface 111 of the heat sink 102. The protrusions 110c are protrusive portions in the radial direction away from the central axis 108, and are formed by cutting the upper portion and the lower portion of the envelope surface 111 using a cutting tool in a machining process after forming the base portion 106 and the heat radiating fins 110 by extrusion or other process. In this way, notch portions 115a and 115b having a substantially L-shape in a side view are formed on the envelope surface 111 at the upper portion and the lower portion of the protrusion 110c in the axial direction. Namely, the protrusion 110c is formed as shown in FIG. 5.

The fan motor unit 104 has the same structure as the first embodiment.

Figure 4:
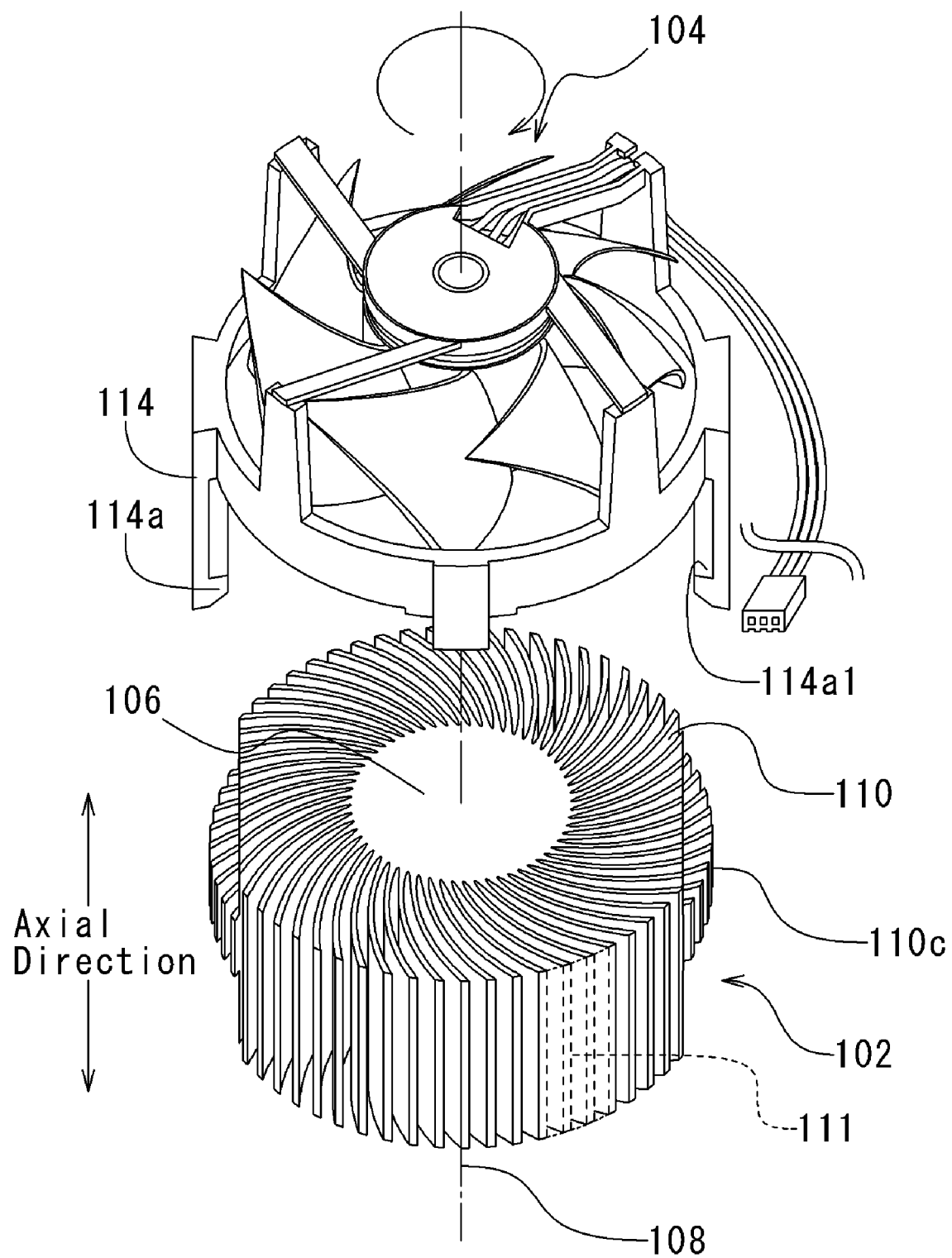
FIG. 4 is a exploded perspective view of a heat sink fan according to a second embodiment of the present invention.
Figure 5:
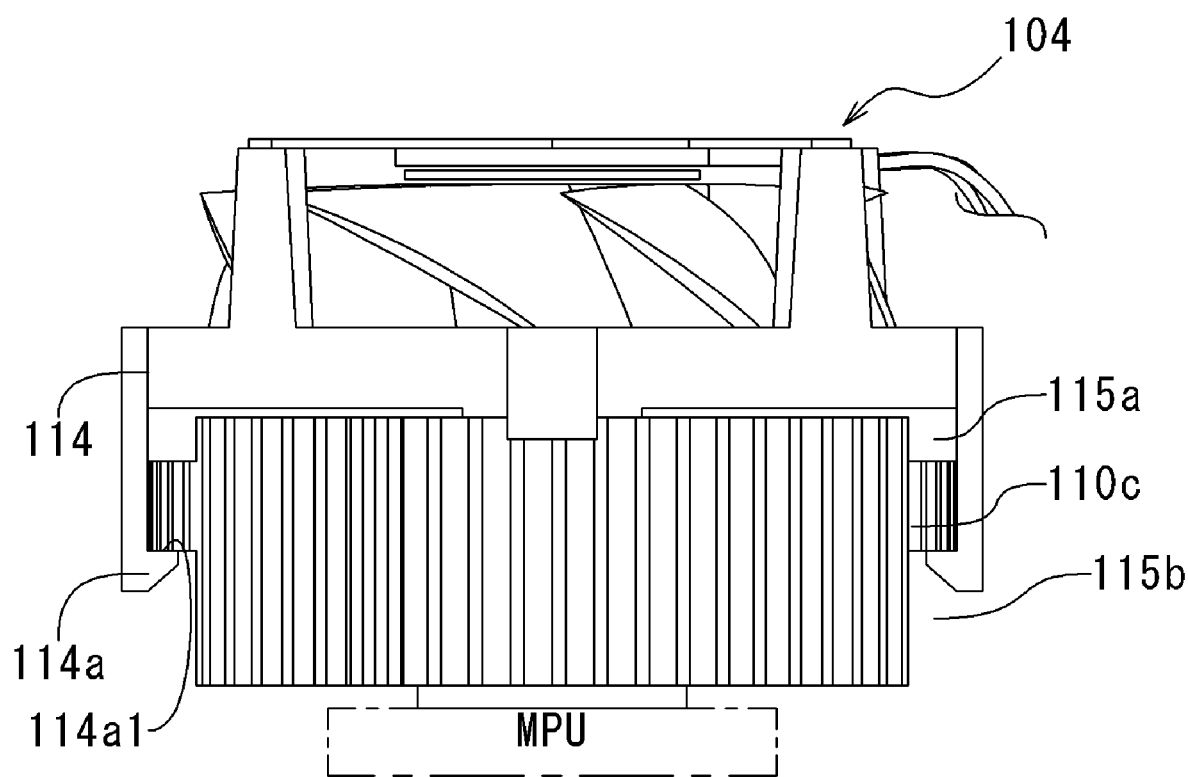
FIG. 5 is a side view of a heat sink illustrated in FIG. 4.

As shown in FIG. 4, in order to attach the fan motor unit 104 to the heat sink 102, the arm portions 114 of the fan motor unit 104 are positioned above the protrusions 110c of the heat sink 102 in the axial direction, and the fan motor unit 104 is moved downward in the axial direction of the heat sink 102. The engaging portions 114a of the arm portions 114 of the fan motor unit 104 contact the protrusions 110c of the heat sink 102 first, and the arm portions 114 are expanded a little in the radial direction away from the central axis 108 by an elastic deformation. When the engaging portions 114a reach the notch portions 115b of the heat sink 102, the engaging portions 114a fit in the notch portions 115b by the elastic restoring force of the arm portions 114. On this occasion, a flat surfaces 114a1 of the engaging portions 114a contact the upper end surface of the protrusions 110c. As a result, movement of the fan motor unit 104 in the axial direction is restricted, so that the fan motor unit 104 is attached to the heat sink 102 securely. In order to detach the fan motor unit 104 from the heat sink 102, the engaging portions 114a are pressed outward slightly away from the central axis 108 first so that the engagements between the protrusions 110c of the heat sink 2 and the engaging portions 114a are released. Then, the fan motor unit 104 is moved upward from the heat sink 102 in the axial direction. Thus, the fan motor unit 104 can be detached from the heat sink 102. In this way, the fan motor unit 104 is detachably attached to the heat sink 102.

Furthermore, although the protrusions is provided to the heat sink, while the engaging portions is provided to the fan motor unit in this embodiment, other structure can be adopted. For example, it is possible that the protrusions is formed on the envelope surface of the heat sink and the engaging portions of fan motor unit is formed as a recesses. Moreover, the shape of the engaging portions 114a of the fan motor unit 104 is not limited to the pawl-like shape but various conventional shapes can be adopted. In addition, although two arm portions 114, two engaging portions 114a and two protrusions are provided as shown in FIGS. 4 and 5, it is possible to provide only one or more than two for each pair of the arm portions 114, engaging portions 114a and protrusions.

Thus, this embodiment can also acquire the same effect as the first embodiment.

Figure 6:
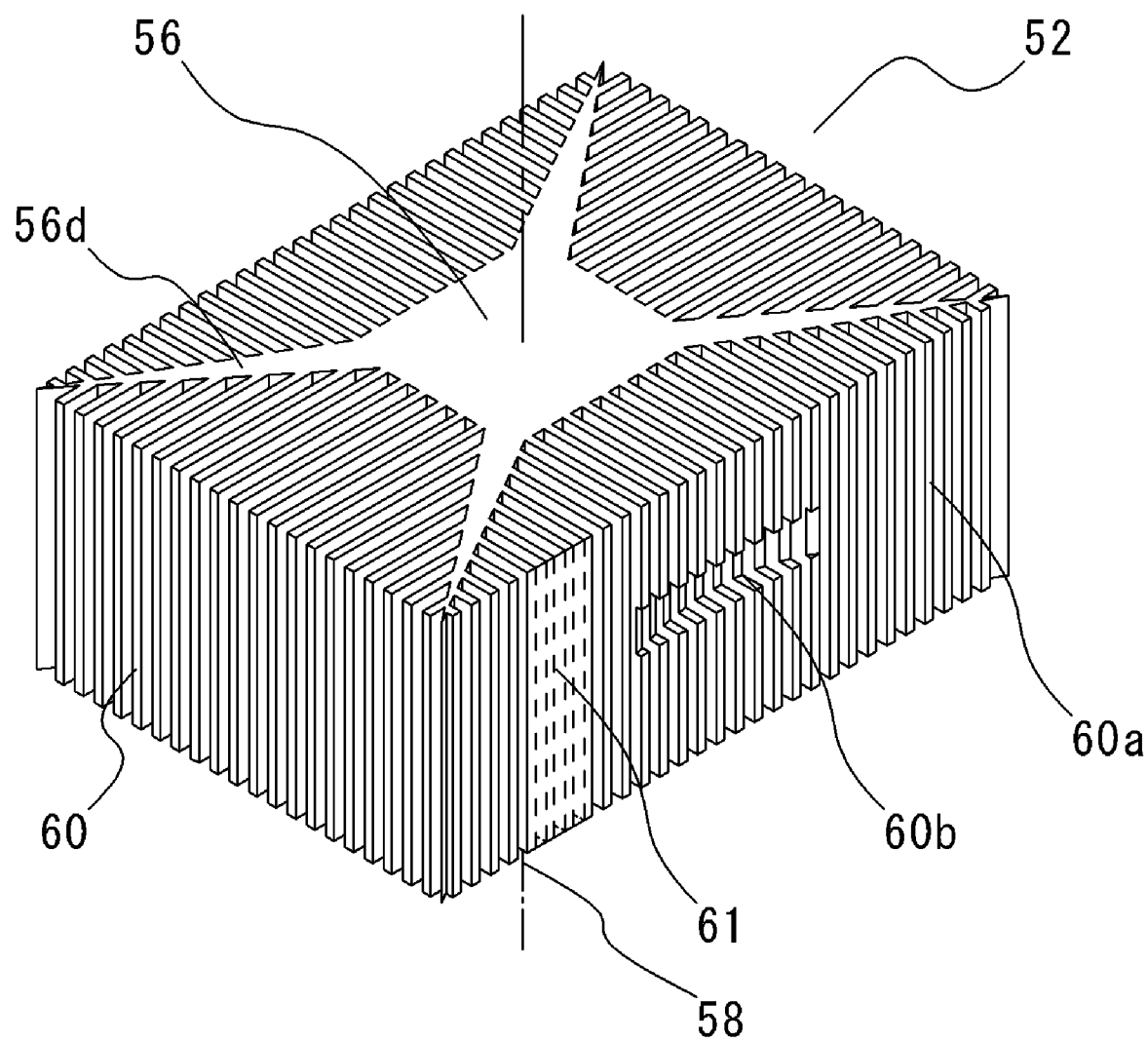
FIG. 6 is a perspective of a heat sink according to a third embodiment of the present invention.

Next, a third embodiment of the present invention will be explained in detail with reference to FIG. 6. The heat sink 52 of this embodiment has a substantially rectangular shape, which is made of aluminum, aluminum alloy, copper, copper alloy or other material having high thermal conductivity by extrusion or other process. The heat sink 52 has a lower end surface that is placed on an MPU or other electrical component and a substantially rectangular base portion 56 with a central axis 58 that is perpendicular to the lower end surface. In addition, the heat sink 52 has leg portions 56d that are formed integrally to the outer periphery of the base portion 56 and extend from edge portions on the outer periphery of the base portion 56 outward in the direction away from the central axis 58. The heat sink 52 also has a plurality of heat radiating fins 60 that extend from the base portion 56 and the leg portions 56d in the direction away from the central axis 58. Each of the heat radiating fins 60 has an end rim faces 60a at the outer end. There is formed a surface that envelopes the plural end rim faces 60a of the heat radiating fins 60 (hereinafter this surface is referred to as an envelope surface 61).

Although the base portion 56 and the heat radiating fins 60 are formed as one unit this embodiment, other structures can also be adopted. For example, the heat sink may be made up of a base member and heat radiating fins. Namely, it is possible to use copper or a copper alloy having higher thermal conductivity for making the base member and to use aluminum, an aluminum alloy, copper or a copper alloy for making the heat radiating fins using. The base member is fixed to the heat radiating fins by a press fitting process to make a heat sink. Since the base member having high thermal conductivity is placed directly on the MPU that generates heat, cooling efficiency of the heat sink is further enhanced.

In addition, recesses 60b are formed on the envelope surface 61 of the heat radiating fins 60 at the area that include plural neighboring heat radiating fins 60. The recesses 60b are formed by a machining process using a cutting tool after forming the base portion 56 and the heat radiating fins 60 by extrusion or other processes.

On the other hand, the fan motor unit is formed in the same way as the first embodiment of the present invention, and only the outer shape of the housing is formed in a substantially rectangular shape.

Even if the outer shape of the heat sink is different, the fan motor unit can be attached to the heat sink 52 securely in the same way as the first embodiment in this embodiment.

It is possible to provide only one or more than two the recesses 60b. It is also possible to replace with recesses 60b and to provide protrusions in the envelope surface 61.

Next, a method for manufacturing the heat sink of the present invention will be explained in detail.

First, a metal material such as aluminum, aluminum alloy having high thermal conductivity is heated up to a predetermined temperature. A die is prepared that has a bore of the same shape as the cross section of the heat sink of the present invention. Then, the above-mentioned metal material held in an extrusion machine is forced to pass through the bore of the die in the extrusion direction. In this way, the heat sink having the base portion and the plurality of radial heat radiating fins is formed. Next, using a cutting tool, a machining process is applied to the envelope surface of the heat sink after the extrusion formation so that protrusions or recesses are formed.

A method for manufacturing the heat sink including the base member and the plurality of heat radiating fins will be explained in detail. First, the column-like base member is formed. Then, using the above-mentioned extrusion method, the heat sink having the plurality of radial heat radiating fins and a central hole arranged in the center of the heat radiating fins is formed. Then, as explained above, a machining process is applied to the envelope surface of the heat sink after the extrusion formation using a cutting tool so that protrusions or recesses are formed. Finally, the base member is pressed to fit in the central hole of the heat radiating fins and is fixed to the heat sink.

Thus, the protrusions or the recesses can be formed easily and correctly on the heat sink. Therefore, a heat sink having a good cooling efficiency can be realized in a low cost.

Though embodiments of the heat sink fan and the method for producing the heat sink that is used for the heat sink fan according to the present invention are explained above, the present invention should be understood as not being limited to the embodiment. Various modifications can be possible within the scope of the present invention.

For example, although the heat sink is formed by extrusion in each embodiment, other processes such as a drawing process or a cutting process can be used for forming a desired shape of the heat sink.

What is claimed is:

1. A heat sink fan for cooling a heat generating electrical component, comprising:
   a heat sink including a base portion with a central axis and a plurality of circumferentially adjacent heat radiating fins integrally or fixedly formed on the side surface of the base portion, each of the heat radiating fins extending away from the central axis and having at least one radially distal edge;
   a fan motor unit including an axial flow fan having a rotational axis, a housing unit connected fixedly with the axial flow fan, the housing unit including a housing and at least one arm portion; wherein
   the fan motor unit is arranged by the housing unit, with the rotational axis substantially corresponding to the central axis, on a first end side of the heat sink, for supplying cooling air to the heat sink;
   the arm portion extends from the housing towards a second end side of the heat sink;
   an engaging portion is formed at a tip of the arm portion; and
   at least one circumferentially partial engagement feature is formed along an envelope of the heat sink by distal-edge protrusions or recesses in a group of several, but not all, adjacent heat radiating fins, for engagement with the engaging portion of the arm portion so that the fan motor unit when attached to the heat sink is restricted in relative movement in the axial direction.

2. The heat sink fan according to claim 1, wherein the protrusion or the recess is formed by a machining process of the envelope surface after forming the base portion and the heat radiating fins.

3. The heat sink fan according to claim 1, the fan motor unit additionally having at least one positioning portion extending from the housing to the second end side of the heat sink, wherein an inner surface of the positioning portion is contacted with a part of the envelope surface of the heat radiating fins, for preventing the fan motor unit from moving against the heat sink radially.

4. The heat sink fan according to claim 1, wherein at least one flat envelope portion is formed on the envelope surface of the heat radiating fins, the flat envelope portion being parallel to the central axis and formed by controlling lengths of a portion of the heat radiating fins in directions away from the central axis.

5. The heat sink fan according to claim 1, wherein the heat radiating fins extend radially with being curved in a predetermined direction with respect to the central axis.

6. The heat sink fan according to claim 1, wherein the heat radiating fins extend radially with being slanted in a predetermined direction with respect to the central axis.

7. The heat sink fan according to claim 1, wherein the engaging portion is formed like a pawl or a hook extending from the tip of the arm portion toward the central axis.

8. The heat sink fan according to claim 1, wherein two or more arm portions are extending from the housing to a second end side of the heat sink.

9. The heat sink fan according to claim 8, wherein two or more positioning portions are extending from the housing to the second end side of the heat sink.

10. A heat sink fan for cooling a heat generating electrical component, comprising:
    a heat sink including a base portion with a central axis and a plurality of circumferentially adjacent heat radiating fins integrally or fixedly formed on the side surface of the base portion, each of the heat radiating fins extending away from the central axis and having at least one radially distal edge;
    a fan motor unit including an axial flow fan having a rotational axis, a housing unit connected fixedly with the axial flow fan, the housing unit including a housing and a plurality of arm portions; wherein
    the fan motor unit is arranged by the housing unit, with the rotational axis substantially corresponding to the central axis, on a first end side of the heat sink, for supplying cooling air to the heat sink;
    the plurality of arm portions extends from the housing towards a second end side of the heat sink;
    an engaging portion is formed at a tip of each of the arm portions; and
    a plurality of circumferentially partial engagement features is formed along an envelope of the heat sink by distal-edge protrusions or recesses in groups of several, but not all, adjacent heat radiating fins, for engagement with the engaging portion of the plurality of arm portions so that the fan motor unit when attached to the heat sink is restricted in relative movement in the axial direction.

11. The heat sink fan according to claim 10, wherein the fan motor unit additionally having at least one positioning portion extending from the housing to the second end side of the heat sink, wherein a inner surface of the positioning portion is contacted with a part of an envelope surface of the heat radiating fins, for preventing the fan motor unit from moving against the heat sink radially.

12. The heat sink fan according to claim 10, wherein the fan motor unit additionally having two or more positioning portions extending from the housing to the second end side of the heat sink, wherein a inner surface of the positioning portions are contacted with a part of an envelope surface of the heat radiating fins, for preventing the fan motor unit from moving against the heat sink radially.

* * * * *